United States Patent
Chuang et al.

(10) Patent No.: US 8,476,126 B2
(45) Date of Patent: Jul. 2, 2013

(54) GATE STACK FOR HIGH-K/METAL GATE LAST PROCESS

(75) Inventors: Harry Hak-Lay Chuang, Hsinchu (TW); Kong-Beng Thei, Hsin-Chu (TW); Chiung-Han Yeh, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 443 days.

(21) Appl. No.: 12/702,012

(22) Filed: Feb. 8, 2010

(65) Prior Publication Data

US 2011/0195549 A1 Aug. 11, 2011

(51) Int. Cl.
*H01L 21/338* (2006.01)
*H01L 21/336* (2006.01)
*H01L 21/3205* (2006.01)
*H01L 21/4763* (2006.01)
*H01L 21/283* (2006.01)

(52) U.S. Cl.
USPC .... 438/183; 438/287; 438/591; 257/E21.159; 257/E21.18; 257/E21.409

(58) Field of Classification Search
USPC ................. 438/183, 216, 287, 591
See application file for complete search history.

(56) References Cited

U.S. PATENT DOCUMENTS

| 5,920,105 | A | 7/1999 | Okamoto et al. |
| 2003/0183877 | A1* | 10/2003 | Yagishita et al. ............. 257/347 |
| 2008/0076216 | A1* | 3/2008 | Pae et al. ........................ 438/257 |
| 2010/0006425 | A1* | 1/2010 | Fu et al. .................... 204/192.25 |
| 2010/0155860 | A1* | 6/2010 | Colombo et al. ............. 257/412 |
| 2011/0062524 | A1* | 3/2011 | Lin et al. ....................... 257/369 |

OTHER PUBLICATIONS

Chinese Patent Office, Office Action dated Feb. 23, 2012, Application No. 201010108455.7, 6 pages.

* cited by examiner

*Primary Examiner* — Charles Garber
*Assistant Examiner* — Calvin Choi
(74) *Attorney, Agent, or Firm* — Haynes and Boone, LLP

(57) ABSTRACT

A method for fabricating an integrated circuit device is disclosed. An exemplary method includes providing a substrate; forming a high-k dielectric layer over the substrate; forming a first capping layer over the high-k dielectric layer; forming a second capping layer over the first capping layer; forming a dummy gate layer over the second capping layer; performing a patterning process to form a gate stack including the high-k dielectric layer, first and second capping layers, and dummy gate layer; removing the dummy gate layer from the gate stack, thereby forming an opening that exposes the second capping layer; and filling the opening with a first metal layer over the exposed second capping layer and a second metal layer over the first metal layer, wherein the first metal layer is different from the second metal layer and has a work function suitable to the semiconductor device.

20 Claims, 6 Drawing Sheets

GATE STACK FOR HIGH-K/METAL GATE LAST PROCESS

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed.

The continuing decrease in technology nodes has lead to a desire to replace a conventional polysilicon gate electrode with a metal gate electrode to improve device performance. One process for forming a metal gate structure (i.e., having a metal gate electrode) is referred to as a "gate last" process, where a final gate stack is fabricated last. This reduces the number of subsequent processes, including high temperature processing, that must be performed after formation of the gate structure. However, there are challenges to implementing such features and processes in conventional fabrication. As the gate length and spacing between devices decreases, these problems are exacerbated. For example, conventional gate replacement processes exhibit gap fill issues and higher than desirable gate leakage. Accordingly, what is needed is an improved method for fabricating an IC device.

SUMMARY

The present disclosure provides for many different embodiments. An exemplary method includes providing a substrate; forming a high-k dielectric layer over the substrate; forming a first capping layer over the high-k dielectric layer; forming a second capping layer over the first capping layer; forming a dummy gate layer over the second capping layer different from the first capping layer; performing a patterning process to form a gate stack including the high-k dielectric layer, first and second capping layers, and dummy gate layer; removing the dummy gate layer from the gate stack, thereby forming an opening that exposes the second capping layer; and filling the opening with a first metal layer over the exposed second capping layer and a second metal layer over the first metal layer, wherein the first metal layer is different from the second metal layer and has a work function suitable to the semiconductor device.

Yet another exemplary method includes providing a substrate; forming a high-k dielectric layer over the substrate; forming a first capping layer over the high-k dielectric layer; forming a second capping layer over the first capping layer; forming a dummy gate layer over the second capping layer; and forming a hard mask layer over the dummy gate layer. A gate stack can then be formed including the high-k dielectric layer, first and second capping layers, dummy gate layer, and hard mask layer. The hard mask layer and dummy gate layer can be removed from the gate stack, thereby forming an opening that exposes the second capping layer; and the opening can be filled with a metal gate electrode, such that the metal gate electrode is disposed over the exposed second capping layer.

Yet another exemplary method includes providing a substrate; forming a gate dielectric layer over the substrate; forming a titanium nitride layer over the gate dielectric layer; forming a tantalum nitride layer over the titanium nitride layer; forming a dummy gate layer over the titanium nitride layer; and forming a hard mask layer over the dummy gate layer. The method further includes performing a gate replacement process. The gate replacement process can include forming a first gate stack in a n-type metal-oxide-semiconductor transistor (NMOS) region and a second gate stack in a p-type metal-oxide-semiconductor transistor (PMOS) region; removing the hard mask layer and dummy gate layer from the first gate stack, resulting in a first opening, wherein the tantalum nitride layer is exposed; removing the hard mask layer and dummy gate layer from the second gate stack, resulting in a second opening, wherein the tantalum nitride layer is exposed; forming a first metal layer in the first opening of the first gate structure, the first metal layer having a first work function; forming a second metal layer in the second opening of the second gate structure, the second metal layer having a second work function different from the first work function; and filling a third metal layer in the first opening of the first gate structure and the second opening of the second gate structure.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
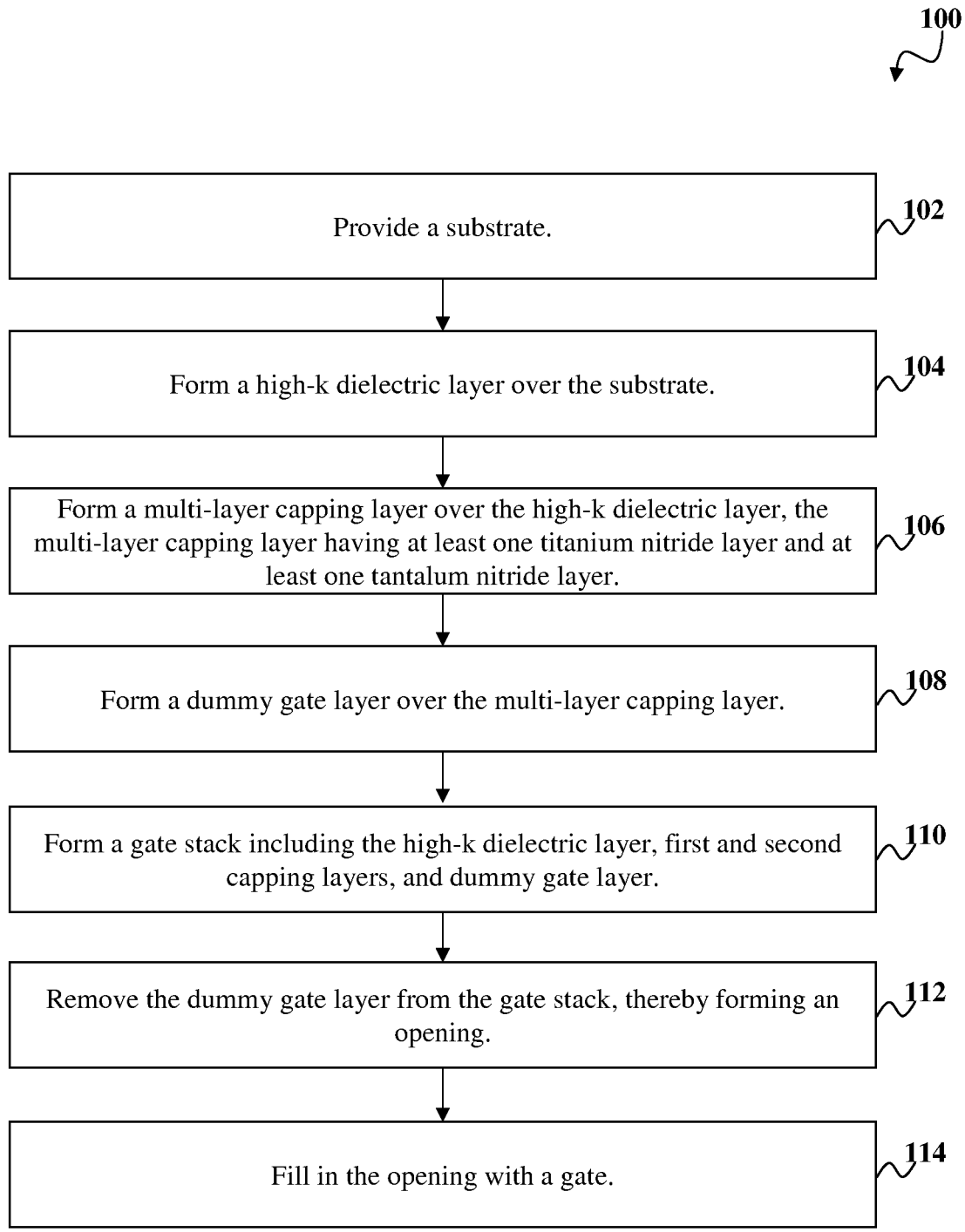
FIG. 1 is a flow chart of a method for fabricating an integrated circuit device according to aspects of the present disclosure.

The present disclosure relates generally to methods for manufacturing integrated circuit devices, and more particularly, to gate replacement processes (or methods).

It is to be understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed between the first and second features, such that the first and second features may not be in direct contact.

With reference to FIGS. 1-6, a method 100 and a semiconductor device 200 are collectively described below. The semiconductor device 200 illustrates an integrated circuit, or portion thereof, that can include memory cells and/or logic circuits. The semiconductor device 200 can include passive components such as resistors, capacitors, inductors, and/or fuses; and active components, such as P-channel field effect transistors (PFETs), N-channel field effect transistors (NFETs), metal-oxide-semiconductor field effect transistors (MOSFETs), complementary metal-oxide-semiconductor transistors (CMOSs), high voltage transistors, and/or high frequency transistors; other suitable components; and/or combinations thereof. It is understood that additional steps can be provided before, during, and after the method 100, and some of the steps described below can be replaced or eliminated for additional embodiments of the method. It is further understood that additional features can be added in the semiconductor device 200, and some of the features described below can be replaced or eliminated for additional embodiments of the semiconductor device 200.

FIG. 1 is a flow chart of one embodiment of the method 100 for fabricating the semiconductor device 200 in a "gate last" process. In the gate last process, a dummy poly gate structure is formed first and then the dummy poly gate structure is removed and replaced with a metal gate structure. FIGS. 2-6 are various cross-sectional views of the semiconductor device 200 according to one embodiment, in portion or entirety, during various fabrication stages of the method 100. The semiconductor device 200 may be formed by CMOS technology processing, and thus some processes are not described in detail herein.

A conventional gate replacement process provides a single titanium nitride (TiN) capping layer over a high-k dielectric layer during the gate replacement process. After a dummy gate structure is removed from over the single TiN capping and high-k dielectric layers, a metal gate structure is formed in an opening where the dummy gate structure was removed. The conventional process partially fills the opening with a tantalum nitride (TaN) layer, such that the TaN layer is formed over the TiN capping layer and adjacent the sidewalls of the opening, and fills the remainder of the opening with a metal layer, such that the metal layer is surrounded by the TaN layer. As technology nodes continue to decrease, it has been observed that the conventional gate replacement process presents gap filling issues and higher than desirable gate leakage.

The method 100 implements a gate replacement process that forms a titanium nitride capping layer prior to forming the dummy gate structure and prior to performing the gate replacement process. More particularly, the method 100 implements a multi-layer capping layer including at least one titanium nitride layer and at least one tantalum nitride layer before forming a dummy gate layer. Forming the multi-layer capping layer (including a TiN layer and a TaN layer) can eliminate gap filling issues, for example, by allowing a subsequently formed metal gate (gate layer) to entirely fill the opening left by the removed dummy gate layer without void issues. Further, when the multi-layer capping layer includes a TaN layer as the top layer, the TaN layer can act as an etch stop layer for the dummy gate removal process, preventing damage to the high-k dielectric layer, which sometimes results from dry/wet etching processes used to remove the dummy gate. The disclosed method 100 has further been observed to improve overall device performance. For example, the method 100 can reduce leakage current and improve time dependent dielectric breakdown (TDDB) reliability (for example, by increasing the time related to TDDB). It is understood that different embodiments may have different advantages, and that no particular advantage is necessarily required of any embodiment.

Figure 2:
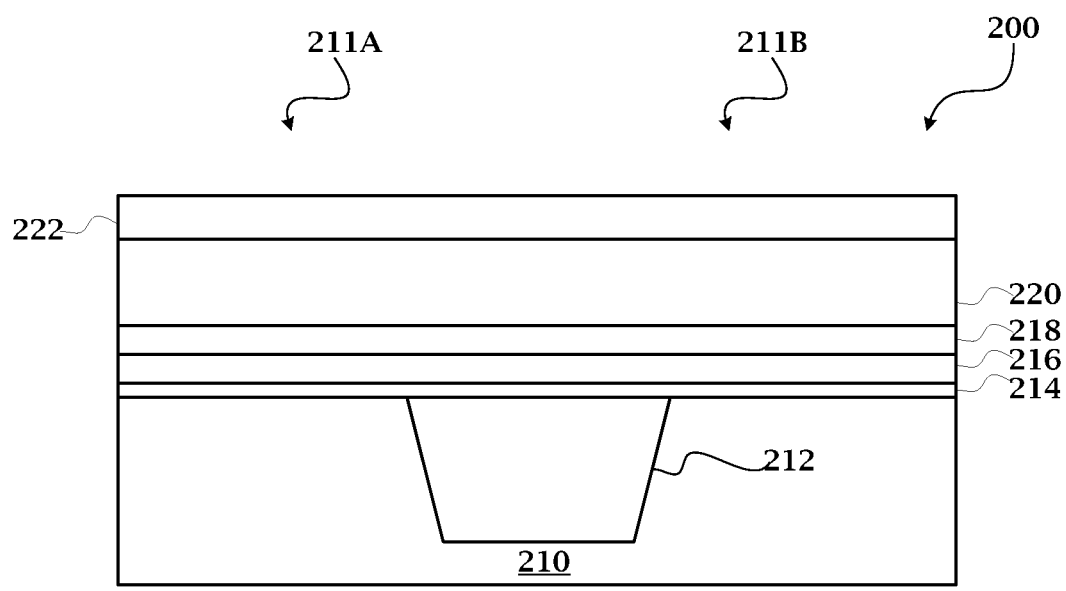
FIGS. 2-6 are various cross-sectional views of an integrated circuit device during various fabrication stages according to the method of FIG. 1.

Referring to FIGS. 1 and 2, at block 102 of the method 100, a substrate 210 is provided. In the present embodiment, the substrate 210 is a semiconductor substrate including silicon. Alternatively, the substrate 210 includes an elementary semiconductor including germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 210 includes various doped regions depending on design requirements as known in the art (e.g., p-type wells or n-type wells). The doped regions are doped with p-type dopants, such as boron or $BF_2$; n-type dopants, such as phosphorus or arsenic; or combinations thereof. The doped regions can be formed directly on the substrate 210, in a P-well structure, in a N-well structure, in a dual-well structure, or using a raised structure. In the present embodiment, the substrate 210 includes a first region 211A and a second region 211B. The first region 211A can be configured for an N-type metal-oxide-semiconductor transistor device (referred to as an NMOS device), and the second region 211B can be configured for a P-type metal-oxide-semiconductor transistor device (referred to as a PMOS device).

An isolation region 212 is formed on the substrate 210 to isolate various regions (e.g., first and second regions 211A, 211B) of the substrate 210, and in the present example, to isolate the NMOS and PMOS device regions. The isolation region 212 utilizes isolation technology, such as LOCOS or STI, to define and electrically isolate the various first and second regions 211A, 211B. The isolation region 212 includes silicon oxide, silicon nitride, silicon oxynitride, other suitable materials, and/or combinations thereof. The isolation region 212 is formed by any suitable process. As one example, the formation of an STI includes a photolithography process, etching a trench in the substrate (for example, by using a dry etching and/or wet etching), and filling the trench (for example, by using a chemical vapor deposition process) with one or more dielectric materials. The filled trench may have a multi-layer structure such as a thermal oxide liner layer filled with silicon nitride or silicon oxide.

With further reference to FIGS. 1 and 2, at blocks 104, 106, and 108, various material layers are formed over the substrate 210. For example, a high-k dielectric layer 214, a multi-layer capping layer (e.g., a first capping layer 216 and a second capping layer 218), a dummy gate layer 220, and a hard mask layer 222 are formed over the substrate 210. The various material layers are formed by deposition processes, such as chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), plating, other suitable methods, and/or combinations thereof.

At block 104, the high-k dielectric layer 214 is formed over the substrate 210. The high-k dielectric layer 214 includes a high-k dielectric material, such as $HfO_2$, HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric materials, and/or combinations thereof.

At block 106, the multi-layer capping layer is formed over the high-k dielectric layer 214. In the present embodiment, the multi-layer capping layer includes a first capping layer 216 and a second capping layer 218. The multi-layer capping layer includes at least one layer including titanium nitride (TiN) and at least one layer including tantalum nitride (TaN). For example, the first capping layer 216 includes TiN, and the second capping layer 218 includes TaN. Alternatively, the first capping layer 216 includes TaN, and the second capping layer 218 includes TiN. Another alternative multi-capping layer includes a bottom TaN layer, a middle TiN layer, and a top TaN layer. Yet another alternative multi-capping layer includes a bottom TiN layer, a middle TaN layer, and a top TiN layer. Other materials and combinations of material layers are contemplated for the multi-layer capping layer.

At block 108, after forming the multi-layer capping layer, the dummy gate layer 220 is formed over the multi-layer capping layer (i.e., first and second capping layers 216, 218). In the present example, the dummy gate layer 220 includes polysilicon. Other materials are contemplated for the dummy gate layer 220, and the dummy gate layer 220 can include multiple material layers.

Figure 3:
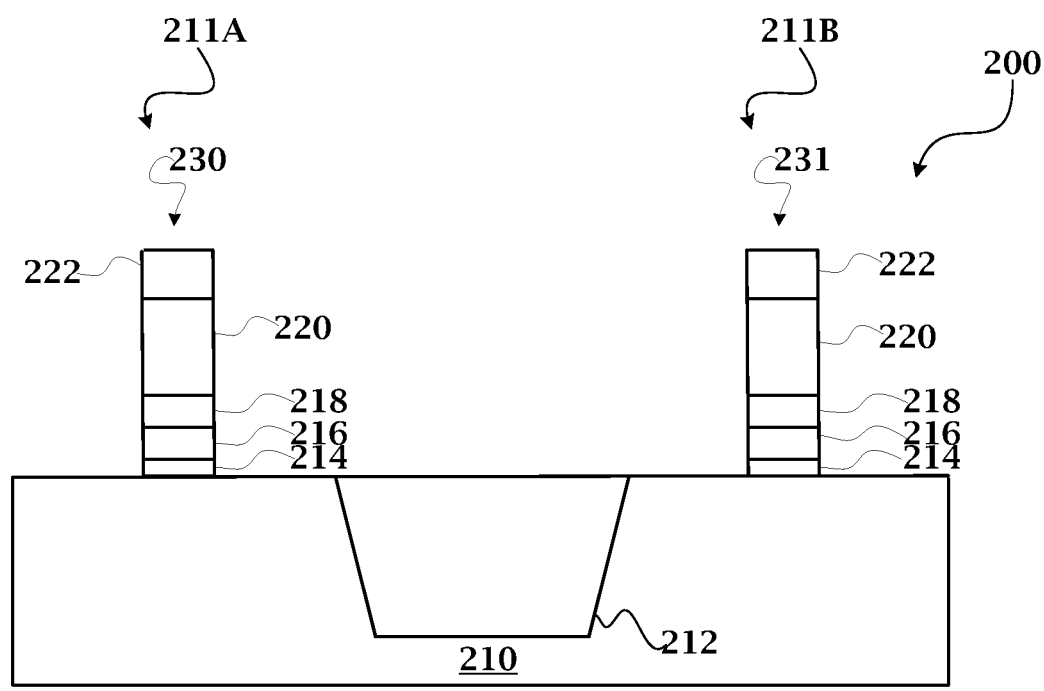

Referring to FIGS. 1-3, at block 110, a gate stack including the high-k dielectric layer 214, multi-layer capping layer (i.e., first and second capping layers 216, 218), and dummy gate layer 220 is formed. In the present example, a gate stack 230 is formed in the first region 211A, and a gate stack 231 is formed in the second region 211B. The gate stack is formed by any suitable process. For example, a hard mask layer 222 is formed over the dummy gate layer 220. The hard mask layer 222 includes silicon nitride, silicon oxynitride, silicon carbide, and/or other suitable material. A photoresist layer is formed over the hard mask layer 222 by a suitable process, such as spin-on coating, and the photoresist layer is patterned to form a patterned feature. The pattern of the photoresist is then transferred to the underlying layers (for example, by an etching process) to form the gate stacks 230, 231 including hard mask layer 222, dummy gate layer 220, first and second capping layers 218, 216, and high-k dielectric layer 214 as shown in FIG. 3. The photoresist layer may be stripped thereafter. The photolithography patterning process includes photoresist coating (e.g., spin-on coating), soft baking, mask aligning, exposure, post-exposure baking, developing the photoresist, rinsing, drying (e.g., hard baking), other suitable processes, and/or combinations thereof. Alternatively, the photolithography exposing process is implemented or replaced by other proper methods, such as maskless photolithography, electron-beam writing, or ion-beam writing. The etching processes include dry etching, wet etching, and/or other etching methods. It is understood that the above example does not limit the processing steps that may be utilized to form the gate stack. It is further understood that the gate stack can include additional layers.

Figure 4:
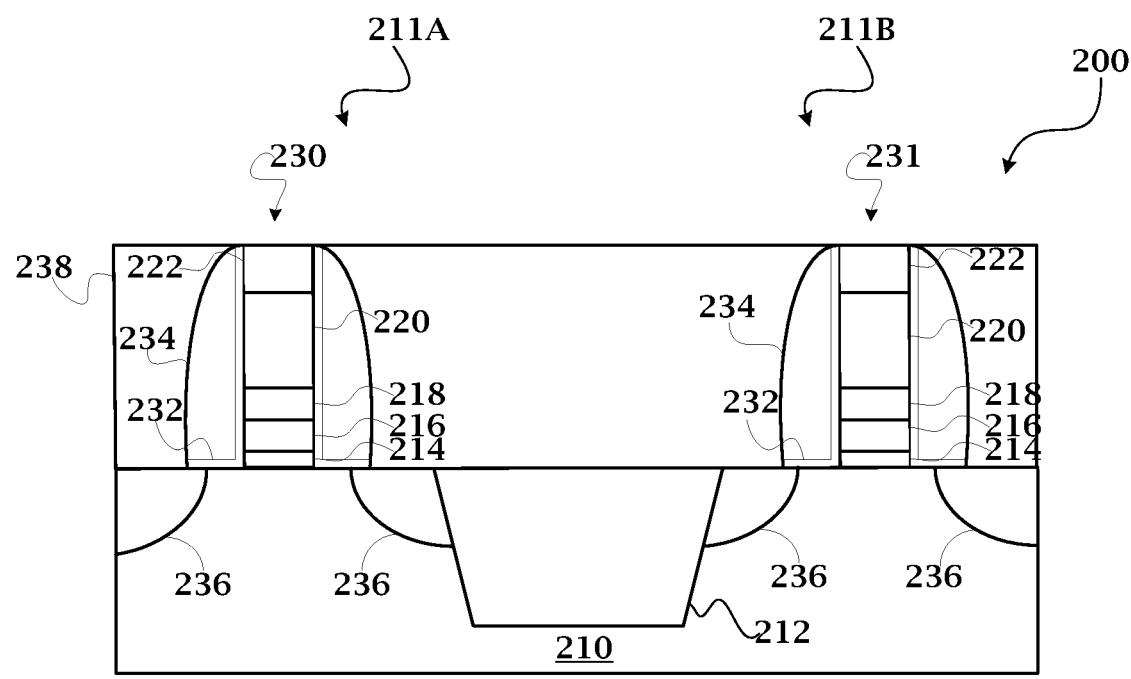

Referring to FIG. 4, subsequent processing can include forming gate spacer liner 232, gate spacers 234, doped regions 236, and/or an interlayer (or inter-level) dielectric (ILD) layer 238. The spacer liner 232 and gate spacers 234 are formed by any suitable process to any suitable thickness. The gate spacers 234 are positioned adjacent the gate stack and include a dielectric material, such as silicon nitride, silicon carbide, silicon oxynitride, other suitable materials, and/or combinations thereof. In an example, the spacer liner 232 includes an oxide material (e.g., silicon oxide), and the gate spacers 234 includes a nitride material (e.g., silicon nitride). The gate spacers 234 can be used to offset subsequently formed doped regions, such as heavily doped source/drain regions.

The doped regions 236 are formed in the substrate 210. The doped regions 236 can include lightly doped source/drain (LDD) regions and/or source/drain (S/D) regions (also referred to as heavily doped S/D regions). The doped regions 236 are formed by ion implantation processes, photolithography processes, diffusion processes, annealing processes (e.g., rapid thermal annealing and/or laser annealing processes), and/or other suitable processes. The doping species depends on the type of device being fabricated and includes p-type dopants, such as boron or $BF_2$; n-type dopants, such as phosphorus or arsenic; and/or combinations thereof. Additionally, the doped regions 236 can include raised S/D regions. The raised S/D regions can be formed by an epitaxy process, such as a CVD deposition techniques (e.g., vapor-phase epitaxy (VPE) and/or ultra-high vacuum CVD (UHV-CVD)), molecular beam epitaxy, and/or other suitable processes.

The ILD layer 238 is formed over the substrate 210. The ILD layer 238 includes a dielectric material, such as silicon oxide, silicon nitride, silicon oxynitride, TEOS formed oxide, phosphosilicate glass (PSG), borophosphosilicate glass (BPSG), low-k dielectric materials, other suitable dielectric materials, and/or combinations thereof. Exemplary low-k dielectric materials include fluorinated silica glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, other proper materials, and/or combinations thereof. The ILD layer 238 can include a multilayer structure having multiple dielectric materials. Subsequent to the deposition of the ILD layer 238, a chemical mechanical polishing (CMP) process is performed, such that a top portion of the gate structure is reached/exposed. Particularly, a top portion of the gate stack including the hard mask layer 222 and dummy gate 220 is exposed as illustrated in FIG. 4.

Figure 5:
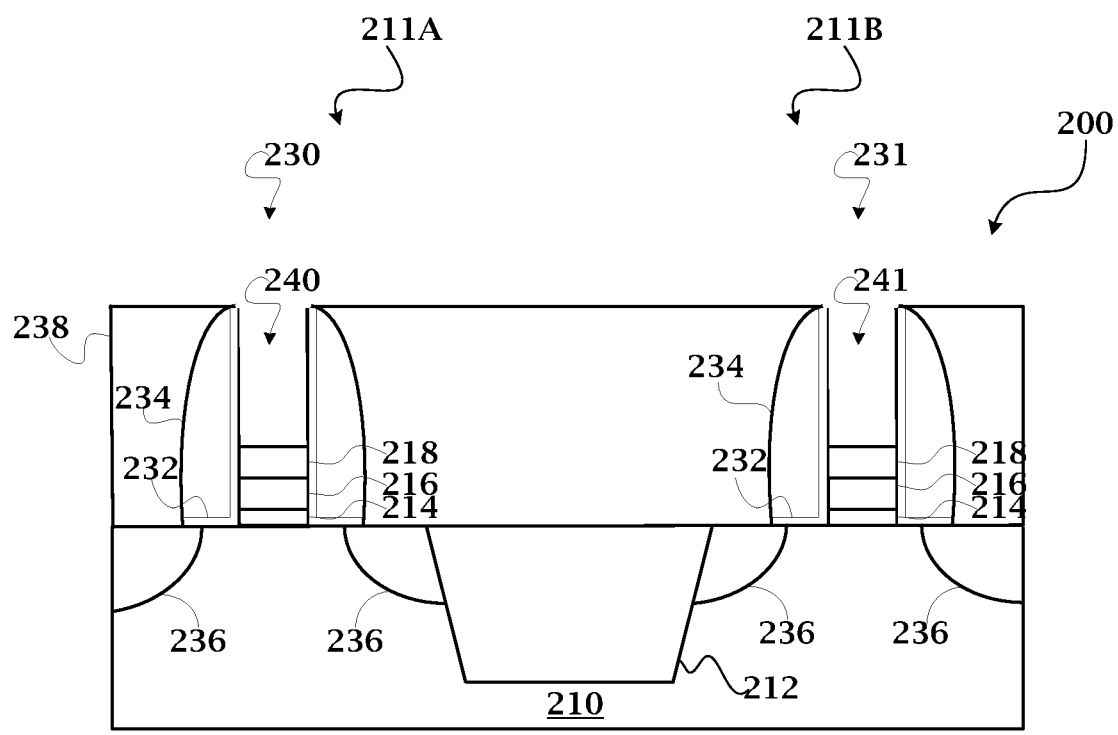
Figure 6:
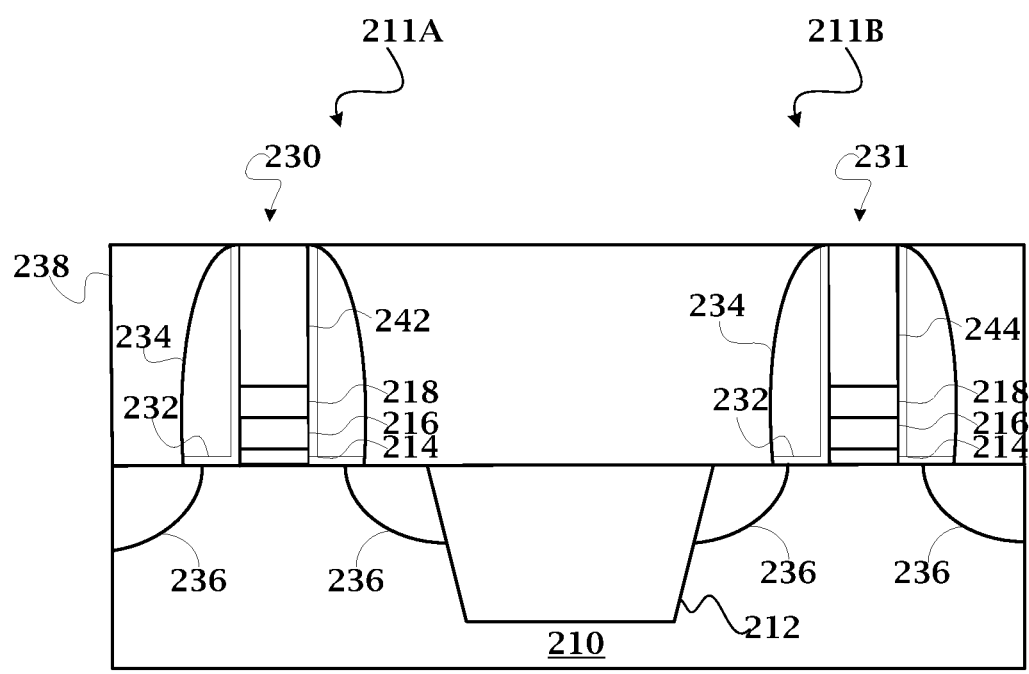

At blocks 112 and 114, a gate replacement process is performed, where the dummy gate layer 220 is replaced with a gate, such as a metal gate. Referring to FIGS. 5 and 6, the hard mask layer 222 and dummy gate layer 220 is removed from the gate stacks 230, 231, thereby forming a trench (opening) 240, 241. The opening 240, 241 exposes the multi-layer capping layer, particularly the second capping layer 218. A gate 242, 244 is then formed in the trench (opening) 240. The gate 242, 244 fills the trench/opening 240, 241 and is disposed over the exposed multi-layer capping layer (i.e., second capping layer 218). The hard mask layer 222/dummy gate layer 220 can be removed from the gate stacks 230 simultaneously or independently by any suitable process, such as a dry etching and/or wet etching process.

The gate 242 and gate 244 can include the same or different materials and/or thicknesses. In the present example, the gates 242, 244 include aluminum tuned to have varying work functions (i.e., gate 242 is tuned to have a n-type work function and gate 244 is tuned to have a p-type work function). Alternatively, the gate 242, 244 includes interfacial layers, high-k dielectric layers, capping layers, a material layer with a proper work function, conductive layers, other suitable layers, and/or combinations thereof. For example, the gates 242, 244 can include a conductive layer having a proper work function or tuned to the proper work function (therefore also referred to as a work function layer) and a conductive material layer formed on the work function layer. In various examples, the work function layer includes tantalum, tantalum nitride, nickel silicide, cobalt silicide, TiN, WN, TiAl, TiAlN, TaCN, TaC, TaSiN, other suitable material, or combination thereof. The conductive material layer formed on the work function layer includes a suitable conductive material, such as aluminum, tungsten, or copper. The conductive material layer may additionally or collectively include polysilicon, titanium, tantulum, metal alloys, other suitable materials, and/or combinations thereof. Subsequent to the formation of the gate 242, 244, a CMP process may be performed to provide a substantially coplanar surface of the gate 242, 244.

It is understood that the semiconductor device 200 may undergo further CMOS or MOS technology processing to form various features known in the art. Subsequent processing may form various contacts/vias/lines and multilayer interconnect features (e.g., metal layers and interlayer dielectrics)

over the substrate 210, configured to connect the various features or structures of the semiconductor device 200. The additional features may provide electrical interconnection to the device including the formed metal gate structures. For example, a multilayer interconnection includes vertical interconnects, such as conventional vias or contacts, and horizontal interconnects, such as metal lines. The various interconnection features may implement various conductive materials including copper, tungsten, and/or silicide. In one example a damascene and/or dual damascene process is used to form a copper related multilayer interconnection structure.

Accordingly, the present disclosure provides a device and method that can provide improved device reliability and performance. The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure. For example, although the method implements a "gate last" approach, the methods disclosed herein may be used in a hybrid process in which one type of metal gate is formed in a "gate first" process and the other type of metal gate is formed in a "gate last" process.

What is claimed is:

1. A method for making a semiconductor device, comprising:
   providing a substrate;
   forming a high-k dielectric layer over the substrate;
   forming a first capping layer over the high-k dielectric layer, wherein the first capping layer includes titanium nitride;
   forming a second capping layer over the first capping layer, the second capping layer being different than the first capping layer, wherein the second capping layer includes tantalum nitride;
   after forming the first and second capping layers, forming a dummy gate layer over the first and second capping layers;
   performing a patterning process to form a gate stack including the high-k dielectric layer, first and second capping layers, and dummy gate layer;
   removing the dummy gate layer from the gate stack, thereby forming an opening that exposes the second capping layer; and
   filling the opening with a first metal layer over the exposed second capping layer and a second metal layer over the first metal layer, wherein the first metal layer is different from the second metal layer and has a work function suitable to the semiconductor device.

2. The method of claim 1 wherein the step of forming the dummy gate layer includes forming a polysilicon layer.

3. The method of claim 1 wherein the semiconductor device is one of a n-type metal-oxide-semiconductor field effect transistor (MOSFET) and a p-type MOSFET and the first metal layer has the work function tuned to the one MOSFET.

4. The method of claim 1 wherein the step of forming the gate stack including the high-k dielectric layer, first and second capping layers, and dummy gate layer includes:
   forming a hard mask layer over the dummy gate layer;
   patterning the hard mask layer;
   transferring the pattern of the hard mask layer to the dummy gate layer, first and second capping layers, and high-k dielectric layer.

5. The method of claim 1, wherein removing the dummy gate layer from the gate stack includes etching the dummy date layer and the second capping layer acting as an etch stop layer.

6. A method for fabricating an integrated circuit device, the method comprising:
   providing a substrate;
   forming a high-k dielectric layer over the substrate;
   forming a multi-layer capping layer over the high-k dielectric layer, wherein the multi-layer capping layer includes at least one titanium nitride layer and at least one tantalum nitride layer;
   after forming the multi-layer capping layer, forming a dummy gate over the multi-layer capping layer;
   performing a patterning process to form a gate stack including the dummy gate, multi-layer capping layer, and high-k dielectric layer;
   performing a gate replacement process, wherein the dummy gate in the gate stack is replaced with a metal gate electrode, the metal gate electrode being formed over the multi-layer capping layer.

7. The method of claim 6 wherein the step of forming the multi-layer capping layer over the high-k dielectric layer, wherein the multi-layer capping layer includes at least one titanium nitride layer and at least one tantalum nitride layer includes:
   forming a titanium nitride layer over the high-k dielectric layer; and
   forming a tantalum nitride layer over the titanium nitride layer.

8. The method of claim 6 wherein the step of forming the multi-layer capping layer over the high-k dielectric layer, wherein the multi-layer capping layer includes at least one titanium nitride layer and at least one tantalum nitride layer includes:
   forming a tantalum nitride layer over the high-k dielectric layer; and
   forming a titanium nitride layer over the tantalum nitride layer.

9. The method of claim 6 wherein the step of forming the multi-layer capping layer over the high-k dielectric layer, wherein the multi-layer capping layer includes at least one titanium nitride layer and at least one tantalum nitride layer includes:
   forming a first tantalum nitride layer over the high-k dielectric layer;
   forming a titanium nitride layer over the first tantalum nitride layer; and
   forming a second tantalum nitride layer over the titanium nitride layer.

10. The method of claim 6 wherein the step of forming the multi-layer capping layer over the high-k dielectric layer, wherein the multi-layer capping layer includes at least one titanium nitride layer and at least one tantalum nitride layer includes:
   forming a first titanium nitride layer over the high-k dielectric layer;
   forming a tantalum nitride layer over the first titanium nitride layer; and
   forming a second titanium nitride layer over the tantalum nitride layer.

11. The method of claim 6 wherein the step of forming the dummy gate over the multi-layer capping layer includes forming a polysilicon layer over the multi-layer capping layer.

12. The method of claim 6 wherein the step of performing the gate replacement process, wherein the dummy gate in the gate stack is replaced with the metal gate electrode includes:
performing an etching process to remove the dummy gate structure, wherein the multi-layer capping layer acts an etch stop layer, such that the etching process stops when the multilayer capping layer is reached;
depositing a first metal layer within an opening where the dummy gate structure is removed;
depositing a second metal layer on the first metal layer; and
performing a chemical mechanical polishing (CMP) process.

13. The method of claim 6 wherein the step of performing the gate replacement process, wherein the dummy gate in the gate stack is replaced with the metal gate electrode includes:
removing the dummy gate from a first gate stack of a first gate structure and a second gate stack of a second gate structure, thereby forming a first opening and a second opening;
forming a first metal layer in the first opening of the first gate structure, the first metal layer having a first work function;
forming a second metal layer in the second opening of the second gate structure, the second metal layer having a second work function different from the first work function; and
filling a third metal layer in the first opening of the first gate structure and the second opening of the second gate structure.

14. The method of claim 6 further including forming a set of spacers adjacent the gate stack prior to performing the gate replacement process.

15. A method comprising:
providing a substrate;
forming a gate dielectric layer over the substrate;
forming a titanium nitride layer over the gate dielectric layer;
forming a tantalum nitride layer over the titanium nitride layer;
after forming the tantalum nitride layer over the titanium nitride layer, forming a dummy gate layer over the tantalum nitride and titanium nitride layers;
forming a first gate stack in a n-type metal metal-oxide-semiconductor transistor (NMOS) region and a second gate stack in a p-type metal-oxide-semiconductor transistor (PMOS) region;
removing the dummy gate layer from the first gate stack, resulting in a first opening, wherein the tantalum nitride layer is exposed;
removing the dummy gate layer from the second gate stack, resulting in a second opening, wherein the tantalum nitride layer is exposed;
forming a first metal layer in the first opening, the first metal layer having a n-type work function; and
forming a second metal layer in the second opening, the second metal layer having a p-type work function.

16. The method of claim 15, wherein the step of forming the gate dielectric layer includes forming a high-k dielectric layer.

17. The method of claim 15, wherein the step of forming the dummy gate layer includes forming a polysilicon layer.

18. The method of claim 15, further comprising:
depositing an aluminum layer over the first metal layer in the first opening and the second metal layer in the second opening, wherein the aluminum layer fills the first and second openings; and
performing a chemical mechanical polishing process on the aluminum layer.

19. The method of claim 15, further including, prior to removing the dummy gate layer from the first and second gate stacks:
forming a set of spacers adjacent the first and second gate stacks;
forming a source and drain region in the substrate adjacent the first and second gate stacks;
forming an interlevel dielectric (ILD) layer over the substrate; and
performing a chemical mechanical polishing (CMP) process on the ILD layer, such that a top surface of the first and second gate stacks is exposed.

20. The method of claim 15, wherein removing the dummy gate layer from the first gate stack includes etching the dummy date layer and the tantalum nitride layer acting as an etch stop layer.

* * * * *